United States Patent
Suzuki et al.

(10) Patent No.: US 7,086,308 B2
(45) Date of Patent: Aug. 8, 2006

(54) AUTOMATIC TRANSMISSION FOR VEHICLE

(75) Inventors: Katsuya Suzuki, Shizuoka-ken (JP); Masaaki Ishiguro, Shizuoka-ken (JP); Shuji Takiguchi, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 477 days.

(21) Appl. No.: 10/602,679

(22) Filed: Jun. 25, 2003

(65) Prior Publication Data

US 2004/0261570 A1 Dec. 30, 2004

(30) Foreign Application Priority Data

Jun. 25, 2003 (JP) .......................... P2002-184356

(51) Int. Cl.
*F16H 57/02* (2006.01)
*B60R 16/02* (2006.01)

(52) U.S. Cl. ................................... 74/606 R; 307/10.1
(58) Field of Classification Search ............. 74/606 R; 307/10.1, 9.1, 147; 701/51; 439/130, 404; 174/72

See application file for complete search history.

(56) References Cited

U.S. PATENT DOCUMENTS

| | | | | |
|---|---|---|---|---|
| 5,349,747 A | * | 9/1994 | Dennis | 307/10.1 |
| 5,692,909 A | * | 12/1997 | Gadzinski | 439/34 |
| 5,729,436 A | * | 3/1998 | Yoshigi et al. | 439/76.2 |
| 5,911,594 A | * | 6/1999 | Baker et al. | 439/404 |
| 6,160,708 A | * | 12/2000 | Loibl et al. | 174/266 |
| 6,530,856 B1 | * | 3/2003 | Kakiage | 74/606 R |
| 6,577,025 B1 | * | 6/2003 | Hentschel et al. | 307/10.1 |
| 6,612,202 B1 | * | 9/2003 | Thorum et al. | 74/606 R |
| 2002/0111730 A1 | * | 8/2002 | Thorum et al. | 701/51 |

FOREIGN PATENT DOCUMENTS

| | | |
|---|---|---|
| JP | 8-324286 | 12/1996 |
| JP | 11-346418 | 12/1999 |
| JP | 2002-12097 | 1/2002 |

* cited by examiner

*Primary Examiner*—Marcus Charles
(74) *Attorney, Agent, or Firm*—Finnegan, Henderson, Farabow, Garrett & Dunner, L.L.P.

(57) ABSTRACT

A main body unit includes a wire cabling circuit body which is formed by bending rigid wires into predetermined cabling pattern shapes, a base member allowing the wire cabling circuit body to be disposed on an upper surface thereof and allowing electronic components such as a read-only memory to be mounted thereon, and a cover which is fixed to the base member in a manner that covers the wire cabling circuit body disposed on the base member. The main body unit is disposed inside a transmission case.

5 Claims, 9 Drawing Sheets

AUTOMATIC TRANSMISSION FOR VEHICLE

BACKGROUND OF THE INVENTION

1. Field of the Invention

The present invention relates to a transmission for a vehicle, more specifically, to a technology which is suitable for a continuous variable automatic transmission for a vehicle.

2. Description of the Related Art

A conventional transmission of this type includes one end side of an input shaft, one end side of an output shaft, a transmission gear mechanism configured to convert rotation of the input shaft into required rotation speed and to transmit the rotation to the output shaft side, electronic components such as sensors required for controlling this transmission gear mechanism, a board configured to retain part of these electronic components, a wire harness configured to transmit signals among the electronic components and to transmit signals with outside, and a transmission case configured to house these components inside while pooling a lubricant to be supplied to the transmission mechanism at a lower part of an internal space thereof.

Assembly work of the conventional transmission needs to involve an operation of housing each of the respective electronic components, the board, and the wire harness in predetermined position inside the transmission case, and an operation of electrically connecting the housed electronic components to connectors of the wire harness. Accordingly, the conventional transmission has been accompanied by inconvenience attributable to the complicated operations of housing the components into the transmission case and of electrically connecting the components to the wire harness.

SUMMARY OF THE INVENTION

It is an object of the present invention to provide a transmission which facilitates an operation of housing components into a transmission case and an operation of electrically connecting the components.

The present invention provides a transmission for a vehicle, including a transmission case, a wire cabling circuit body formed by bending rigid wires into predetermined cabling pattern shapes, a base member allowing the wire cabling circuit body to be disposed on an entire surface thereof and allowing an electronic component to be mounted thereon, and a cover being fixed to the base member in a manner that covers the wire cabling circuit body disposed on the base member. Here, the wire cabling circuit body, the base member, and the cover collectively constitutes a main body unit, and the main body unit is disposed inside the transmission case.

In this transmission, the main unit body is configured by disposing the wire cabling circuit body in a predetermined position of the base member and mounting the electronic component in a predetermined position of the base member, and then by fixing the cover to this base member. Thereafter, the main body unit thus unitized as a body is housed into the transmission case. Accordingly, an operation of housing the components is alleviated. Moreover, since wiring paths, branch circuits or the like to the electronic components are formed by use of the wire cabling circuit body, it is possible to reduce the number of wire harnesses to be disposed inside the transmission case. Furthermore, since the wire cabling circuit body is formed by bending the wires, it is possible to cable the wires as closely as possible.

In a preferred embodiment of the present invention, the base member is provided with wire housing grooves. The wire housing grooves include pattern shapes corresponding approximately to wire cabling patterns of the wire cabling circuit body, and partitions provided on both side faces. Moreover, the wire cabling circuit body is housed in the wire housing grooves.

According to the above-described transmission, the partitions are interposed between the wires which are disposed closely to one another.

It is also possible that the cover is provided with groove cap protrusions having pattern shapes corresponding approximately to the wire cabling patterns of the wire cabling circuit body, such that the groove cap protrusions cover entrance portions of the wire housing grooves.

According to the above-described transmission, it is possible to prevent contamination (iron powder) and the like from entering from the entrances of the wire housing grooves of the base member into the wire housing grooves.

It is also possible to expose a conductive wire inside a covered electric wire by peeling insulation off at an intermediate portion thereof, and the intermediate portion of the electric wire where the conductive wire is exposed may be connected to the wire of the wire cabling circuit body.

According to the above-described transmission, it is possible to moderate a fray of the conductive wire in the electric wire, and thereby to prevent the conductive wire dust from coming into a lubricant.

It is also possible to form a tip portion of the wire of the wire cabling circuit body into a terminal.

According to the above-described transmission, it is not necessary to prepare a separate terminal in addition to the wire cabling circuit body. Moreover, it is not necessary to conduct an operation of connecting the terminal to the wire of the wire cabling circuit body by means of welding or the like.

DETAILED DESCRIPTION OF THE PREFERRED EMBODIMENT

Now, an embodiment of the present invention will be described with reference to the accompanying drawings.

Figure 1:
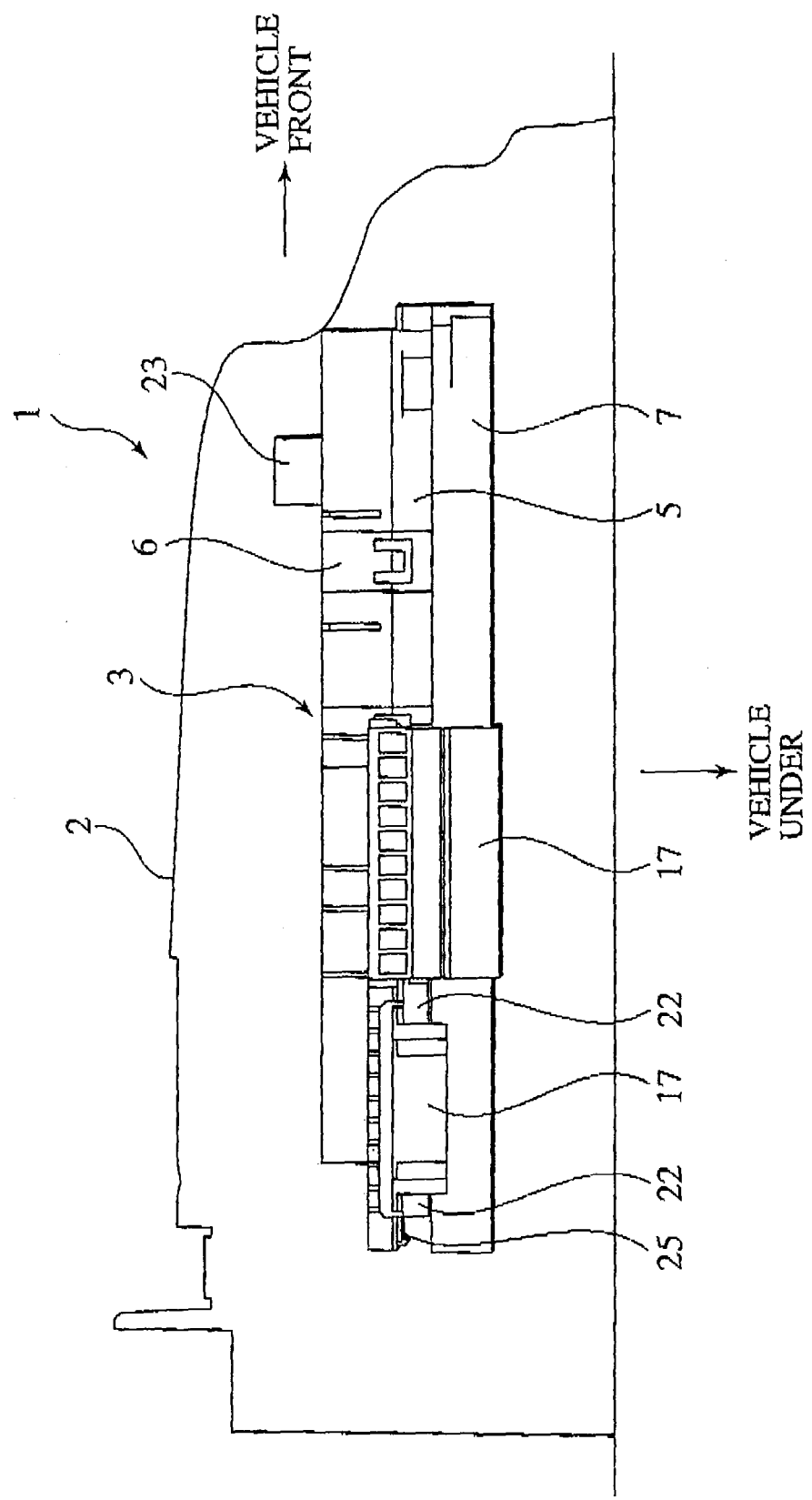
FIG. 1 is a side view of a transmission according to an embodiment of the present invention.

As shown in FIG. 1, a transmission 1 includes a transmission case 2 which retains inside thereof in a hermetically sealed state while pooling a lubricant (not shown) at a lower part in the inside thereof. The transmission case 2 houses one end side of an input shaft (not shown), one end side of an output shaft (not shown), a transmission gear mechanism (not shown) configured to convert rotation of the input shaft into required rotation speed and to transmit the rotation to the output shaft side, a main body unit 3 for mounting electronic components such as sensors, circuits, and the like, which are required for controlling this transmission gear mechanism (not shown), and a wire harness WH (shown in FIG. 5) configured to connect this main body 3 electrically to outside circuits.

Figure 2:
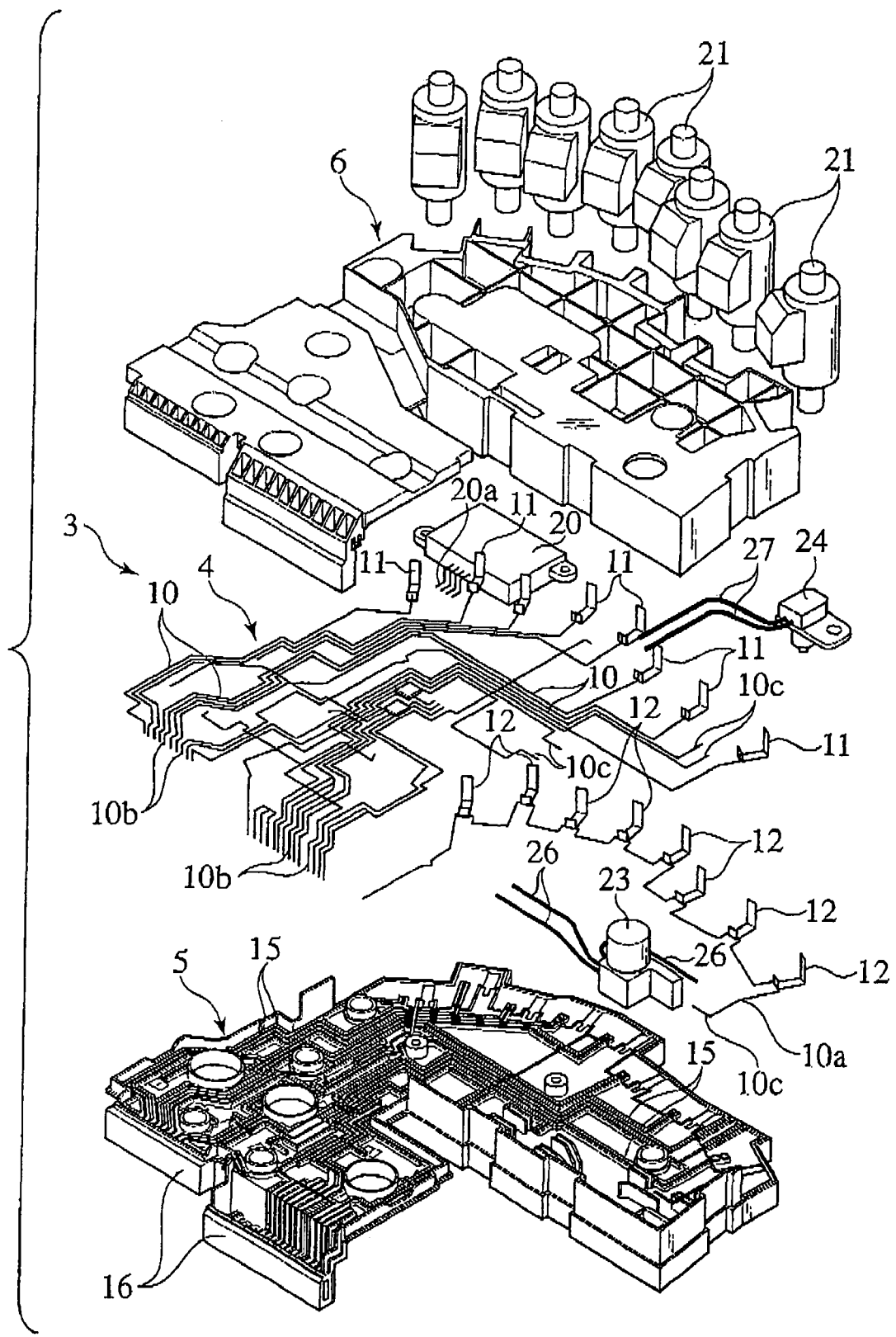
FIG. 2 is an exploded perspective view of a main body unit according to the embodiment of the present invention.
Figure 3:
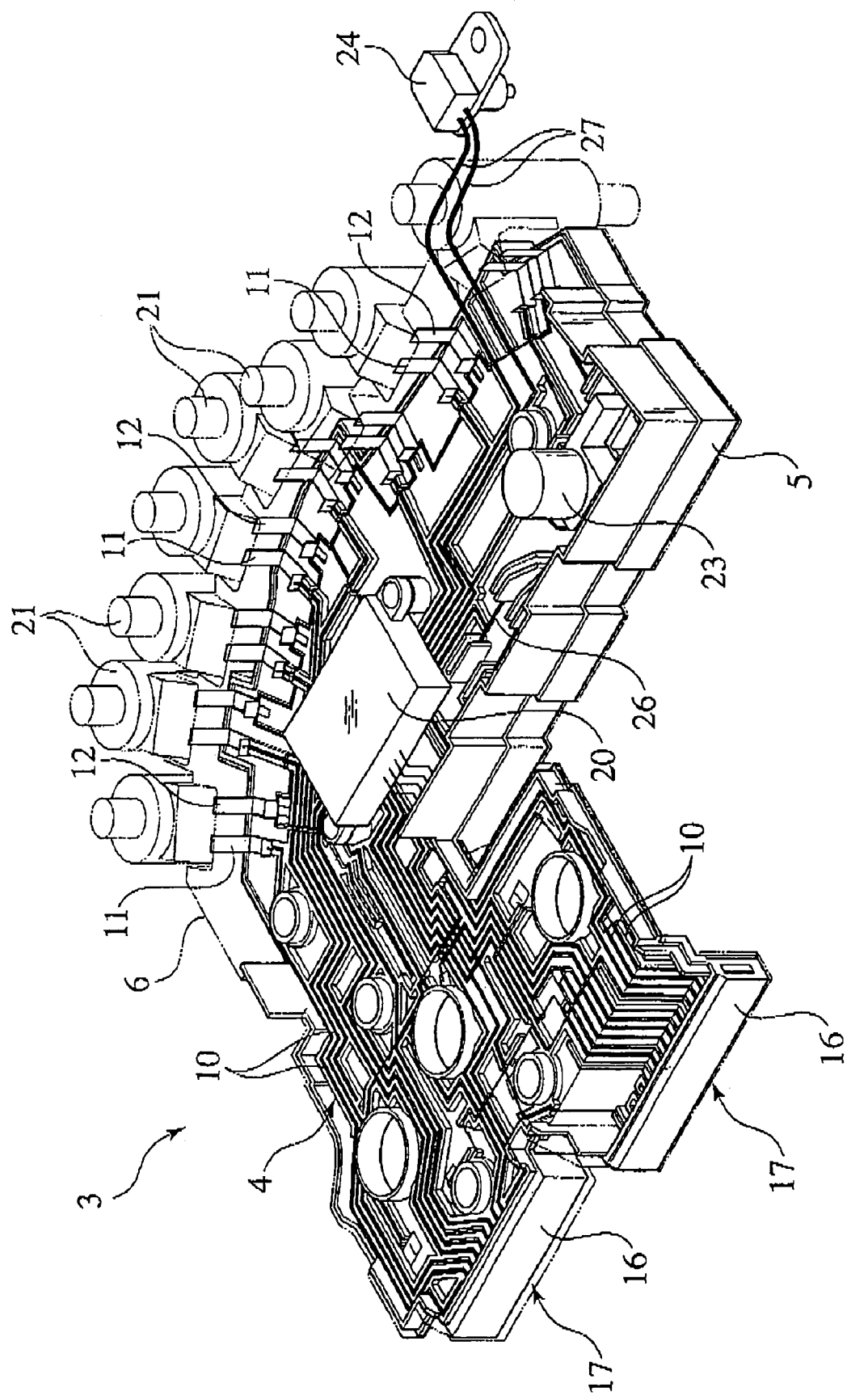
FIG. 3 is a perspective view showing a state of assembling the main body unit according to the embodiment of the present invention.

As shown in FIG. 2 and FIG. 3, the main body unit 3 includes a wire cabling circuit body 4 in which desired circuits are formed by required cabling patterns, a base member 5 which allows this wire cabling circuit body 4 to be disposed on an upper surface thereof, a cover 6 which is fixed to the base member 5 in a manner that covers the wire cabling circuit body 4 disposed on this base member 5, and an upper control valve 7 which is fixed to a lower surface of the base member 5.

Figure 4A:
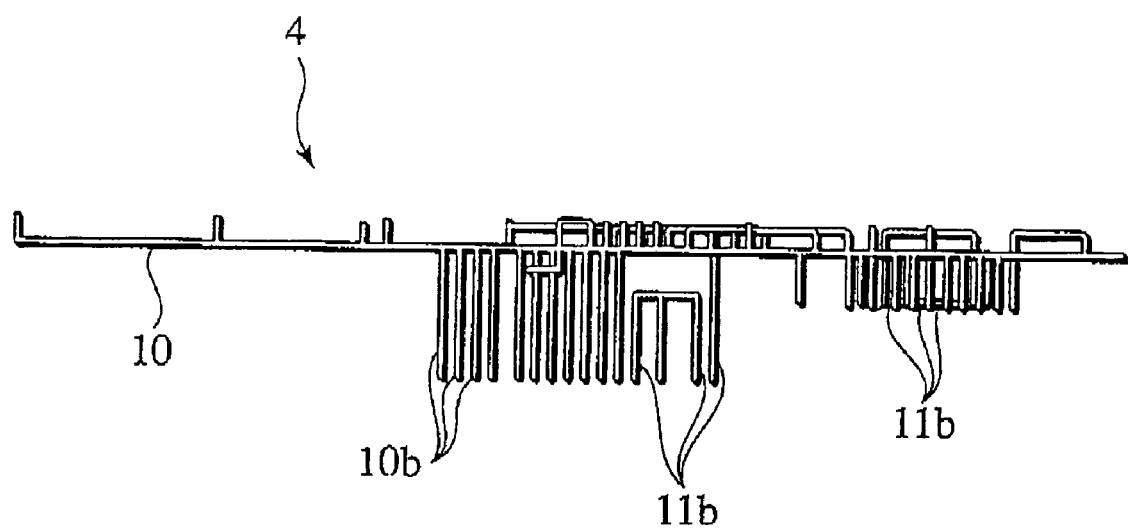
FIG. 4A is a side view of a wire cabling circuit body according to the embodiment of the present invention.
Figure 4B:
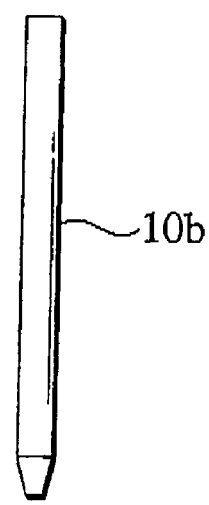
FIG. 4B is an enlarged view of essential part of a portion of a wire formed as a connector terminal.

The wire cabling circuit body 4 is formed by bending a plurality of wires 10 having electric conductivity and rigidity into required cabling patterns. More precisely, the wire cabling circuit body 4 constitutes wiring paths, branch circuits or the like to electronic components. The wires 10 of this embodiment are square wires having a square cross section. The square wires are processed into high-density cabling by use of an automatic wire bending machine. Moreover, some end portions of the wires 10 in the wire cabling circuit body 4 are bent upward, and each of solenoid valve terminals 11 is welded to the respective upward bent portions. The wire cabling circuit body 4 includes one main ground wire 10a, and each of ground terminals 12 for the solenoid valves is welded to appropriate positions on the main ground wire 10a. Meanwhile, some other end portions of the wires 10 in the wire cabling circuit body 4 are bent downward as shown in detail in FIG. 4A and FIG. 4B, and tip portions thereof are formed into tapered shapes and are thereby formed into male connector terminals 10b.

Figure 7:
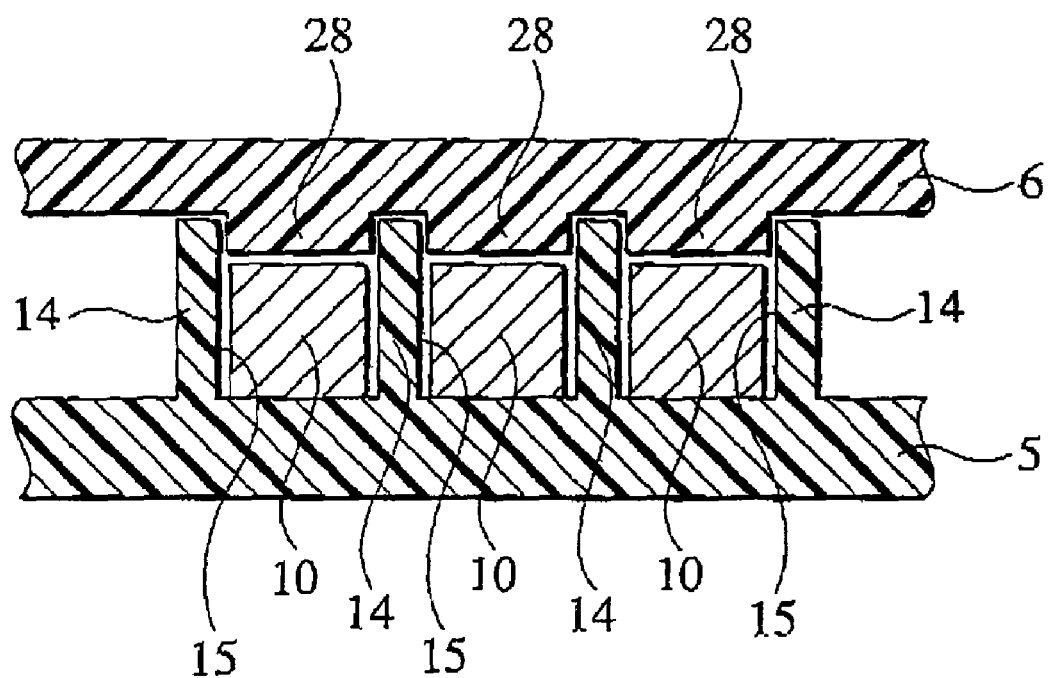
FIG. 7 is a cross-sectional view showing a state of disposition of the wire cabling circuit body according to the embodiment of the present invention.

The base member 5 is made of an insulative material of a flat shape, and wire housing grooves 15, each provided with partitions 14 on both sides in the transverse direction thereof, are provided on an upper surface of the base member 5. The wire housing grooves 15 have pattern shapes corresponding closely to the wire cabling patterns of the wire cabling circuit body 4, and the wire cabling circuit body 4 is housed in the wire housing grooves 15 as shown in detail in FIG. 7. The wire housing grooves are formed in three dimensions with partially different heights, so that the wires 10 of the wire cabling circuit body 4 that cross each other are prevented from contacting each other.

Figure 5:
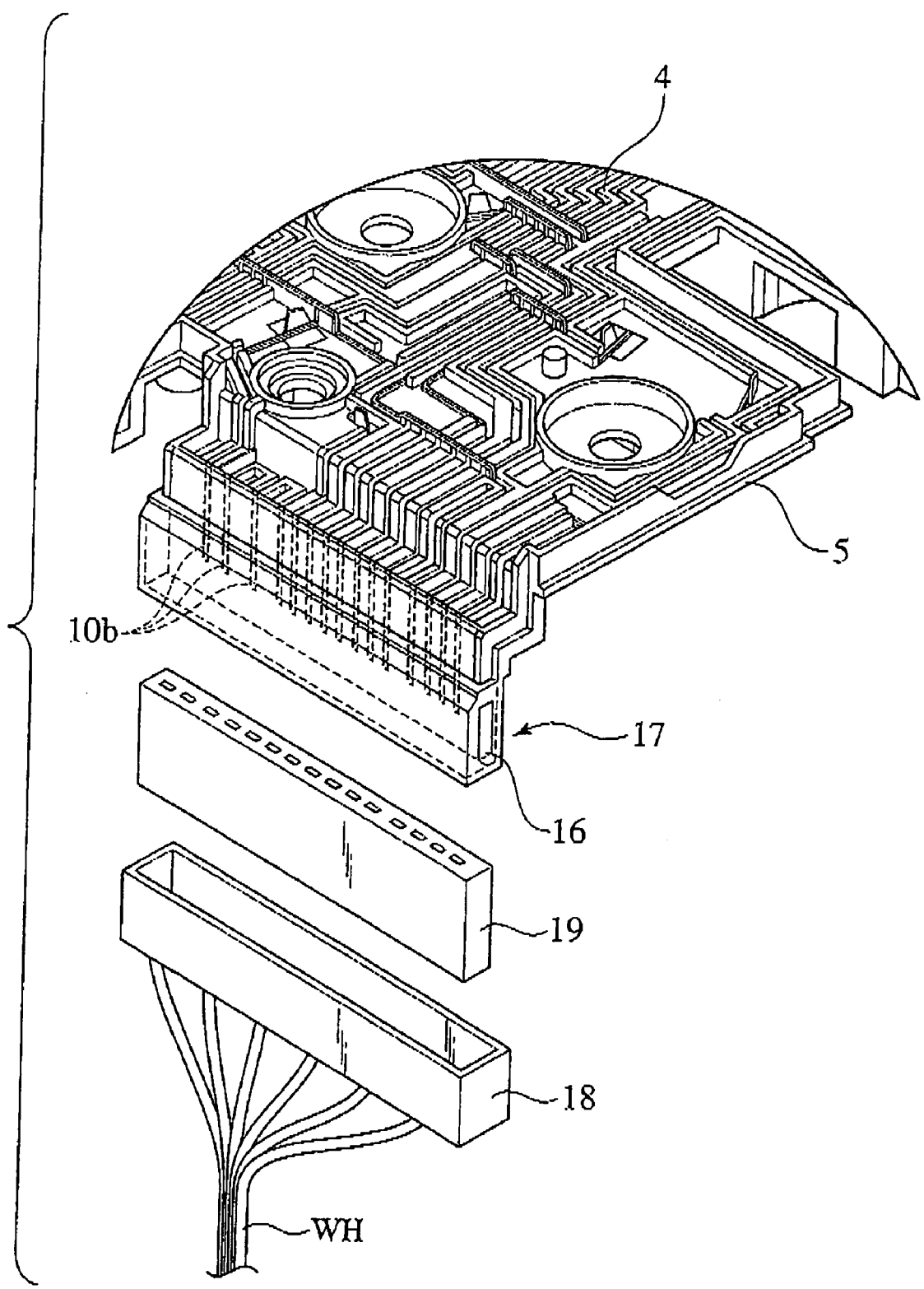
FIG. 5 is an enlarged perspective view showing a state of connection of a connector according to the embodiment of the present invention.

Referring back to FIG. 2 and FIG. 3, connector hood portions 16 are integrally formed in two positions of the base member 5. Each of the connector hood portions 16 is formed so as to extend downward toward below the base member 5, and the respective connector terminals 10b of the wire cabling circuit body 4 are disposed inside these connector hood portions 16. In other words, a connector 17 on the main unit 3 side is composed of the connector hood portion 16, and the connector terminals 10b of the wire cabling circuit body 4. This connector 17 incorporates male terminals as the connector terminals 10b are formed by use of the end portions of the wires 10. As shown in FIG. 5, a connector 18 of the wire harness. WH is connected to this connector 17 via a relay connector 19. That is to say, the connector 18 of the wire harness WH incorporates male terminals Accordingly, the both connectors 17 and 18 are connected to each other via the relay connector 19 which incorporates female terminals on both sides.

Meanwhile, those mounted on the base member 5 are electronic components including a read-only memory (ROM) 20, eight pieces of solenoid valves 21, six pieces of hydraulic switches 22 (shown in FIG. 1), a rotation sensor 23, an oil temperature sensor 24, and the like. The ROM 20 is fixed to the base member 5 with a screw, and lead terminals 20a thereof are welded to required end portions of the wires 10. Each of the solenoid valves 21 includes a terminal insertion hole (not shown) on a lower surface thereof, and the solenoid valve 21 is fitted to the base member 5 by inserting the solenoid valve terminal 11 and the ground terminal 12 for the solenoid valve into this terminal insertion hole. Each of the hydraulic switches 22 is fitted to the lower surface side of the base member 5 via a plate 25 (shown in FIG. 1) and the like. The rotation sensor 23 is fixed to the base member 5 with a bolt (not shown) and a nut (not shown), and lead wires 26 thereof are connected to welding portions 10c of the wires 10 of the wire cabling circuit body 4 by welding. This welding structure will be described below in detail. The oil temperature sensor 24 is fixed to a member other than the base member 5, and lead wires 27 thereof are connected to welding portions 10c of the wires 10 of the wire cabling circuit body 4 by welding. This welding structure will be described below in detail.

Figure 6:
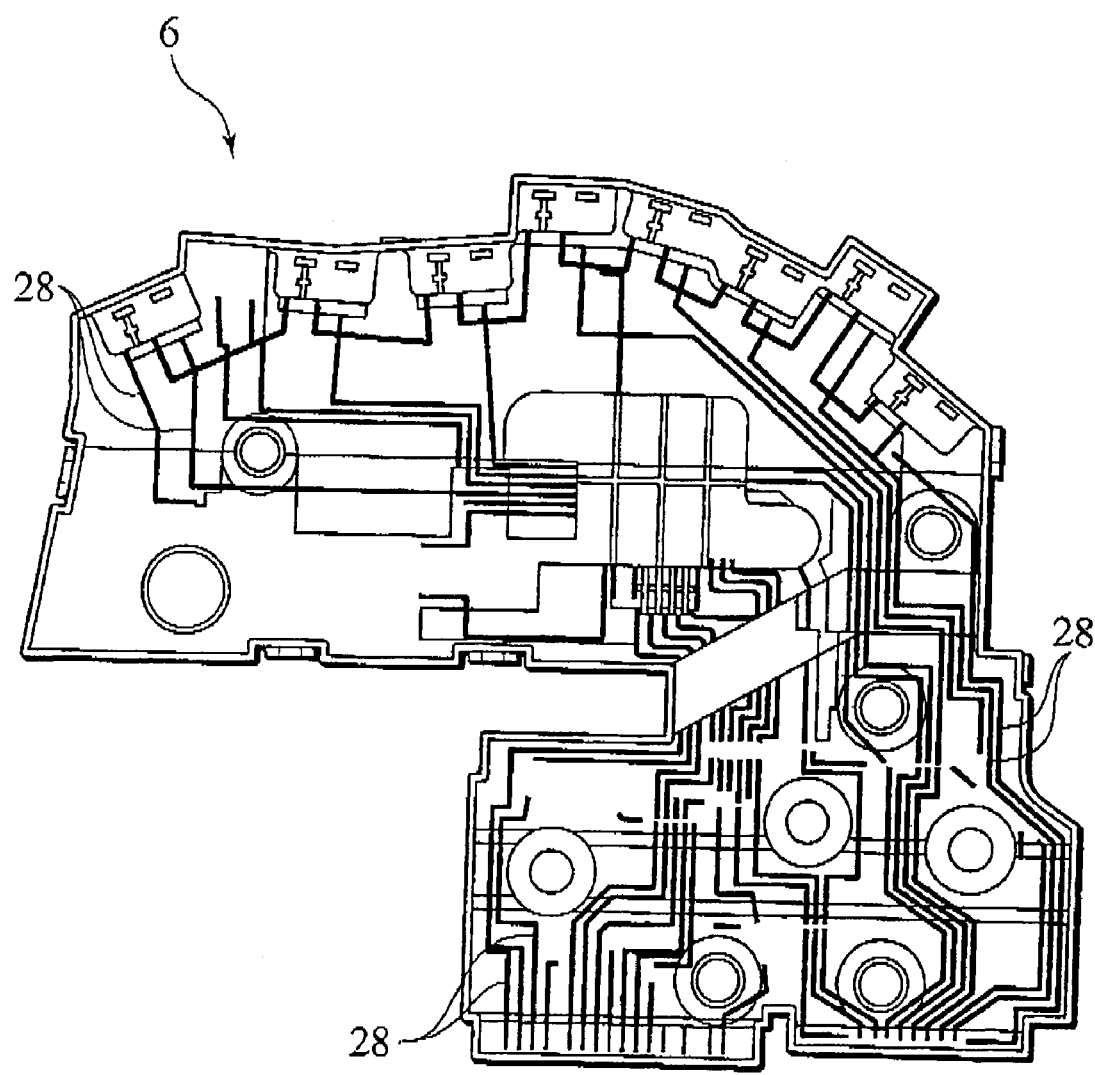
FIG. 6 is an internal view of a cover according to the embodiment of the present invention.

As shown in FIG. 2 and FIG. 3, the cover 6 is made of an insulative material and has a shape so as to cover the almost entire upper surface of the base member 5. As shown in FIG. 6, an inner surface (a lower surface) of the cover 6 is provided with groove covering protrusions 28 having pattern shapes corresponding closely to the wire cabling patterns of the wire cabling circuit body 4. As shown in detail in FIG. 7, the groove covering protrusions 28 go into the wire housing grooves 15 of the base member 5 and thereby cover entrance portions in the wire housing grooves 15. Moreover, lower surfaces of the groove covering protrusions 28 abut substantially on upper surfaces of the respective wires 10 of the wire cabling circuit body 4 housed in the wire housing grooves 15.

Figure 8A:
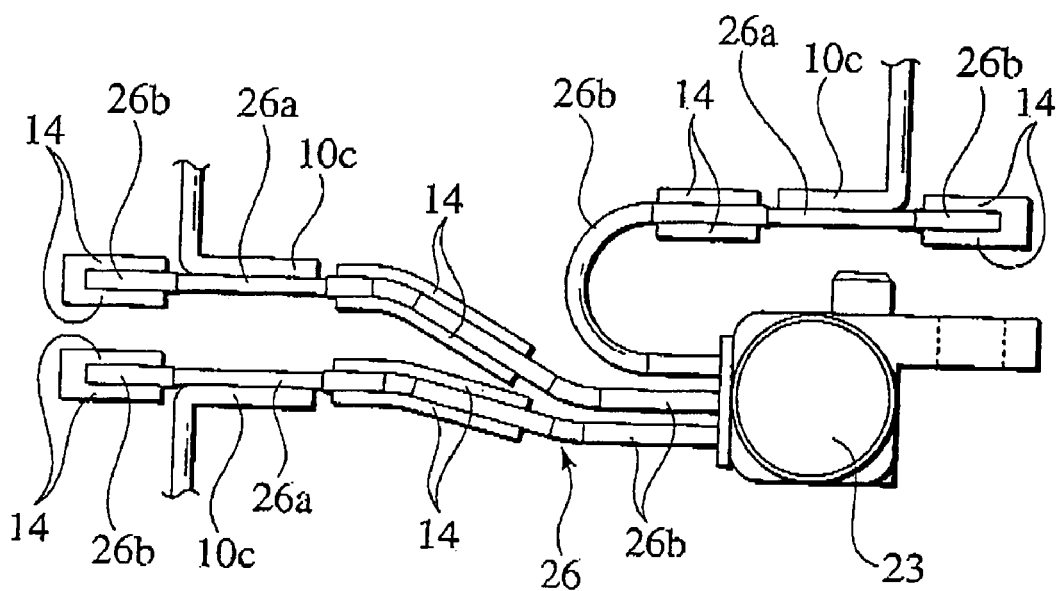
FIG. 8A is a plan view showing a state of welding of a lead wire of a rotation sensor according to the embodiment of the present invention.
Figure 8B:
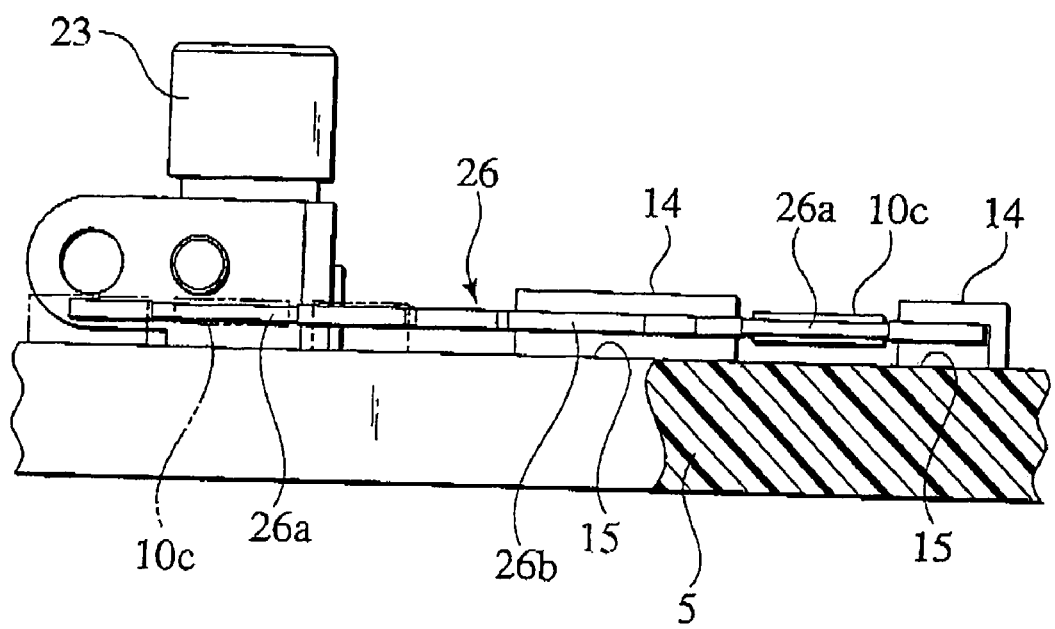
FIG. 8B is a side view showing the state of welding of the lead wire of the rotation sensor according to the embodiment of the present invention.

Next, description will be made regarding the welding structures of the lead wires 26 of the rotation sensor 23 and the lead wires 27 of the oil temperature sensor 24. As shown in FIGS. 8A and 8B, regarding each of the lead wires (electric wires) 26 of the rotation sensor 23, the periphery of a conductive wire 26*a* is surrounded by insulation 26*b*. Regarding each of the lead wires 26, the insulation 26*b* is peeled off in an intermediate position thereof rather than at a tip portion thereof, and the conductive wire 26*a* inside is exposed in the intermediate position. Moreover, the intermediate position where this conductive wire 26*a* is exposed is connected to the welding portion 10*c* of the wire 10 of the wire cabling circuit member 4 by means of welding.

Figure 9A:
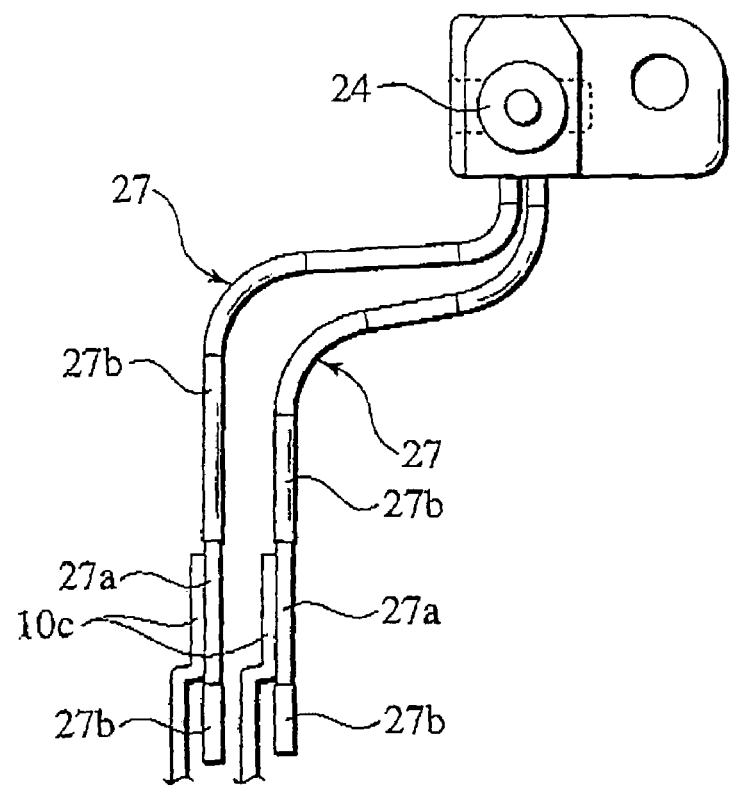
FIG. 9A is a plan view showing a state of welding of a lead wire of an oil temperature sensor according to the embodiment of the present invention.
Figure 9B:
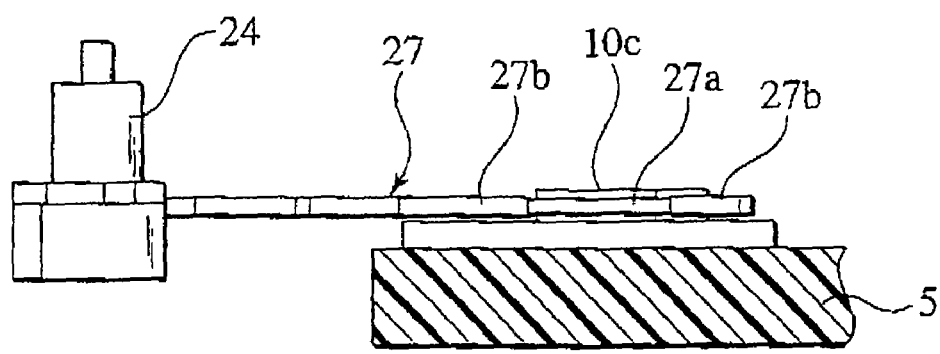
FIG. 9B is a side view showing the state of welding of the lead wire of the oil temperature sensor according to the embodiment of the present invention.

As shown in FIGS. 9A and 9B, regarding each of the lead wires (electric wires) 27 of the oil temperature sensor 24, the periphery of a conductive wire 27*a* is surrounded by insulation 27*b*. Regarding each of the lead wires 27, the insulation 27*b* is peeled off in an intermediate position thereof rather than at a tip portion thereof, and the conductive wire 27*a* inside is exposed in the intermediate position. Moreover, the intermediate position where this conductive wire 27*a* is exposed is connected to the welding portion 10*c* of the wire 10 of the wire cabling circuit body 4 by means of welding.

Next, description will be made regarding an action of assembling the main body unit 3 configured as described above, and an operation for housing the main body unit 3 after the completion of the assembling into the transmission case 2. First, the wire cabling circuit body 4 is housed from an upper side of the base member 5 into the wire housing grooves 15. Accordingly, the wire cabling circuit body 4 is set in a predetermined position of the base member 5. Upon setting, the connector terminals 10*b* of the wire cabling circuit body 4 are inserted into the connector hood portion 16 of the base member 5, and the connector 17 is thereby configured.

Next, the solenoid valve terminals 11 and the ground terminals 12 for the solenoid valves are connected to the required end portions of the wires 10 of the wire cabling circuit body 4 by welding. Moreover, the ROM 20, the hydraulic switches 22 (shown in FIG. 1), the rotation sensor 23, the oil temperature sensor 24, and the like are mounted on predetermined positions of the base member 5. Here, the lead wires 26 and 27 of the rotation sensor 23 and of the oil temperature sensor 24 are welded to the required end portions of the wires 10 as described above.

Next, the cover 6 is placed on the upper surface of the base member 5, whereby the base member 5 and the cover 6 are fixed together. Regarding the cover 6 which is put on the base member 5, the eight pairs of the solenoid valve terminals 11 and the ground terminals 12 for the solenoid valves protrude upward from the cover 6., Accordingly, the solenoid valves 21 are fitted to the respective pairs of the solenoid valve terminals 11 and the ground terminals 12 for the solenoid valves. After the completion of the assembling, the main body unit 3 thus unitized is housed in a predetermined position in the transmission case 2 (see FIG. 1).

As described above, since the unitized main body unit 3 is housed in this transmission 1, the operation of housing the components into the transmission case 2 is alleviated as compared to a conventional transmission. Moreover, the wiring paths, the branch circuits, and the like to the electronic components such as the ROM 20 are formed by use of the wire cabling circuit body 4. Accordingly, the number of wire harnesses (not shown) to be disposed inside the transmission case 2 is reduced. Therefore, the operation of housing the components into the transmission case 2 and the operation of electrically connecting the components become easier as compared to the conventional example. In addition, the wire cabling circuit body 4 is formed by bending the wires 10. Accordingly, it is possible to cable the wires 10 as closely as possible to achieve high-density cabling.

In this embodiment, the base member 5 includes the wire housing grooves 15 having the pattern shapes corresponding closely to the wire cabling patterns of the wire cabling circuit body 4, and the partitions 14 provided on the both side faces thereof. Moreover, the wire cabling circuit body 4 is housed in these wire housing grooves 15. Accordingly, the partitions 14 are interposed between the wires 10 which are closely disposed to each other. As a consequence, it is possible to reduce a possibility of a short circuit attributable to contamination (iron powder) and the like when the wire cabling circuit body 4 includes high-density cabling. In other words, the lubricant spattered inside the transmission case 2 is not adhered directly to the wire cabling circuit body 4 because the wire cabling circuit body 4 is surrounded by the base member and the cover 6. Nevertheless, if the lubricant (not shown) enters between the base member 5 and the cover 6 and if the contamination (the iron powder) contained in the lubricant is adhered to the wire cabling circuit body 4, then the adjacent wires 10 may cause a short circuit through the contamination (the iron powder). However, according to this embodiment, such a possibility of a short circuit attributable to the contamination (the iron powder) entering therein is reduced because the closely disposed wires 10 are separated by the partitions 14.

In this embodiment, the cover 6 is provided with the groove covering protrusions 28 having the pattern shapes corresponding closely to the wire cabling patterns of the wire cabling circuit body 4, and the groove covering protrusions 28 cover the entrance portions in the wire housing grooves 15. Accordingly, the contamination (the iron power) and the like are suppressed to enter from the entrance portions of the wire housing grooves 15 of the base member 5 into the wire housing grooves 15. Therefore, it is possible to reduce a possibility of a short circuit attributable to the contamination (the iron powder) and the like when the wire cabling circuit body 4 includes high-density cabling.

In this embodiment, the intermediate positions of the lead wires 26 and 27 covered with the insulation 26*b* and 27*b* are peeled off so as to expose the conductive wires 26*a* and 27*a*, and the intermediate positions of the lead wires 26 and 27 where the conductive wires 26*a* and 27*a* are exposed are welded to the wires 10 of the wire cabling circuit body 4.

Accordingly, it is possible to moderate frays of the conductive wires 26a and 27a of the lead wires 26 and 27, and thereby to prevent the lubricant from being tampered with dust of the conductive wires 26a and 27a. In this way, it is possible to prevent a short circuit attributable to the dust of the conductive wires 26a and 27a.

In this embodiment, the tip portions of the wires 10 of the wire cabling circuit body 4 are formed into the connector terminals 10b. Accordingly, it is not necessary to prepare separate terminals in addition to the wire cabling circuit body 4. Moreover, it is not necessary to carry out an operation of connecting the terminals to the wire 10 of the wire cabling circuit body 4 by means of welding or the like.

What is claimed is:

1. A transmission for a vehicle comprising:
   a transmission case;
   a wire cabling circuit body formed by bending rigid wires into a shape of predetermined cabling pattern;
   a base member allowing the wire cabling circuit body to be disposed on a surface thereof and allowing an electronic component to be mounted thereon, the base member including wire housing grooves extending in three dimensions; and
   a cover being fixed to the base member in a manner that covers the wire cabling circuit body disposed on the base member,
   wherein the wire cabling circuit body, the base member, and the cover constitutes a main body unit, and the main body unit is disposed inside the transmission case.

2. The transmission according to claim 1, wherein the wire housing grooves are in the shape of patterns corresponding substantially to wire cabling patterns of the wire cabling circuit body, and includes partitions provided on both side faces, and
   the wire cabling circuit body is housed in the wire housing grooves.

3. The transmission according to claim 2,
   wherein the cover comprises groove cap protrusions which are in the shape of the patterns which correspond substantially to the wire cabling patterns of the wire cabling circuit body, and covers entrance portions of the wire housing grooves.

4. The transmission according to claim 1,
   wherein a conductive wire inside a covered electric wire is exposed by peeling insulation off at an intermediate portion thereof, and
   the intermediate position of the electric wire, in which the conductive wire is exposed, is connected to the wire of the wire cabling circuit body.

5. The transmission according to claim 1,
   wherein a tip portion of the wire of the wire cabling circuit body is formed into a terminal.

* * * * *

UNITED STATES PATENT AND TRADEMARK OFFICE
CERTIFICATE OF CORRECTION

| | | |
|---|---|---|
| PATENT NO. | : 7,086,308 B2 | Page 1 of 1 |
| APPLICATION NO. | : 10/602679 | |
| DATED | : August 8, 2006 | |
| INVENTOR(S) | : Katsuya Suzuki et al. | |

It is certified that error appears in the above-identified patent and that said Letters Patent is hereby corrected as shown below:

On the title page, item (30), "Jun. 25, 2003" should read --Jun. 25, 2002--.

Signed and Sealed this

Twenty-eighth Day of November, 2006

JON W. DUDAS
*Director of the United States Patent and Trademark Office*